(12) United States Patent
Winiecki

(10) Patent No.: US 9,496,838 B2
(45) Date of Patent: Nov. 15, 2016

(54) ENVELOPE TRACKING AMPLIFIER FOR A TRANSMITTER HAVING A VOLTAGE MAPPING LINEARLY RELATED TO THE SQUARE OF THE AMPLITUDE OF THE BASEBAND SIGNAL

(71) Applicant: Sequans Communications Limited, Reading (GB)

(72) Inventor: Thomas Winiecki, Reading (GB)

(73) Assignee: SEQUANS COMMUNICATIONS LIMITED, Reading (GB)

( * ) Notice: Subject to any disclaimer, the term of this patent is extended or adjusted under 35 U.S.C. 154(b) by 69 days.

(21) Appl. No.: 13/907,092

(22) Filed: May 31, 2013

(65) Prior Publication Data

US 2014/0018133 A1 Jan. 16, 2014

(30) Foreign Application Priority Data

Jun. 1, 2012 (EP) .................................... 12170564

(51) Int. Cl.
*H04M 1/00* (2006.01)
*H04B 1/38* (2015.01)
*H03G 3/20* (2006.01)
*H03F 1/02* (2006.01)

(52) U.S. Cl.
CPC .............. *H03G 3/20* (2013.01); *H03F 1/0222* (2013.01)

(58) Field of Classification Search
CPC .......... H03F 1/0294; H03F 1/32; H03F 3/24; H03F 1/0205; H03F 2200/336; H03F 2200/102; H03F 1/0211; H03F 1/3241; H03F 2200/387; H03F 2201/3206; H03F 3/45071; H03F 1/30; H03F 2203/21142; H03F 1/0272; H03F 2200/435; H03F 2200/06

See application file for complete search history.

(56) References Cited

U.S. PATENT DOCUMENTS

| | | | | |
|---|---|---|---|---|
| 2011/0150038 | A1* | 6/2011 | Korol | H03F 1/3211 375/130 |
| 2011/0183636 | A1* | 7/2011 | Staudinger | H03F 1/0222 455/102 |
| 2012/0256688 | A1* | 10/2012 | Onishi | 330/149 |
| 2012/0269240 | A1* | 10/2012 | Balteanu et al. | 375/219 |

FOREIGN PATENT DOCUMENTS

| | | | |
|---|---|---|---|
| GB | 2345212 A | 6/2000 | |
| WO | WO 2004/001958 A1 | 12/2003 | |
| WO | WO 2004/019486 A1 | 3/2004 | |
| WO | WO 2011086752 | * 7/2011 | ............... H03F 1/02 |

OTHER PUBLICATIONS

Extended European Search Report, EP 12170564, date of mailing Oct. 17, 2012.

* cited by examiner

*Primary Examiner* — Golam Sorowar
(74) *Attorney, Agent, or Firm* — Hamilton, Brook, Smith & Reynolds, P.C.

(57) ABSTRACT

An envelope tracking amplifier for a transmitter has a voltage mapping linearly related to the square of the amplitude of the baseband signal.

11 Claims, 8 Drawing Sheets

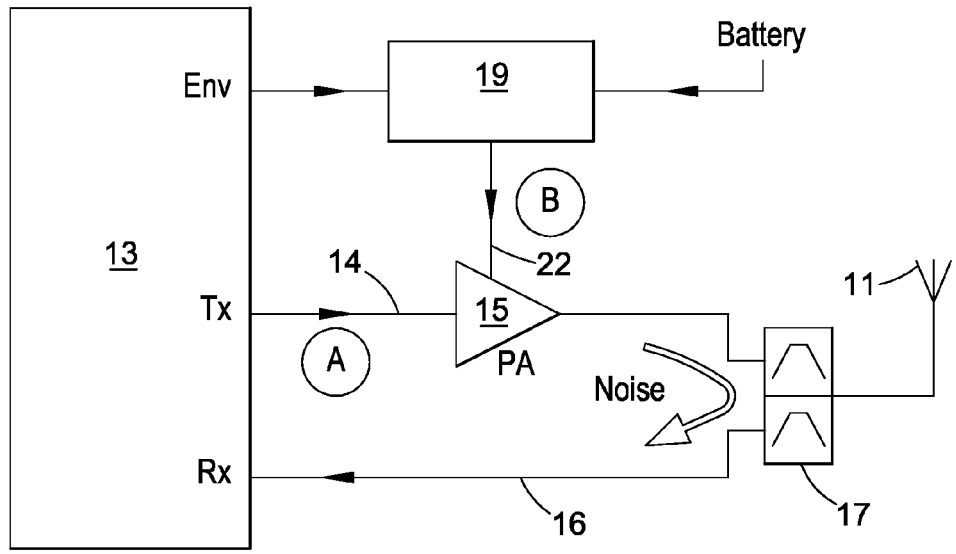
Fig. 1 - PRIOR ART
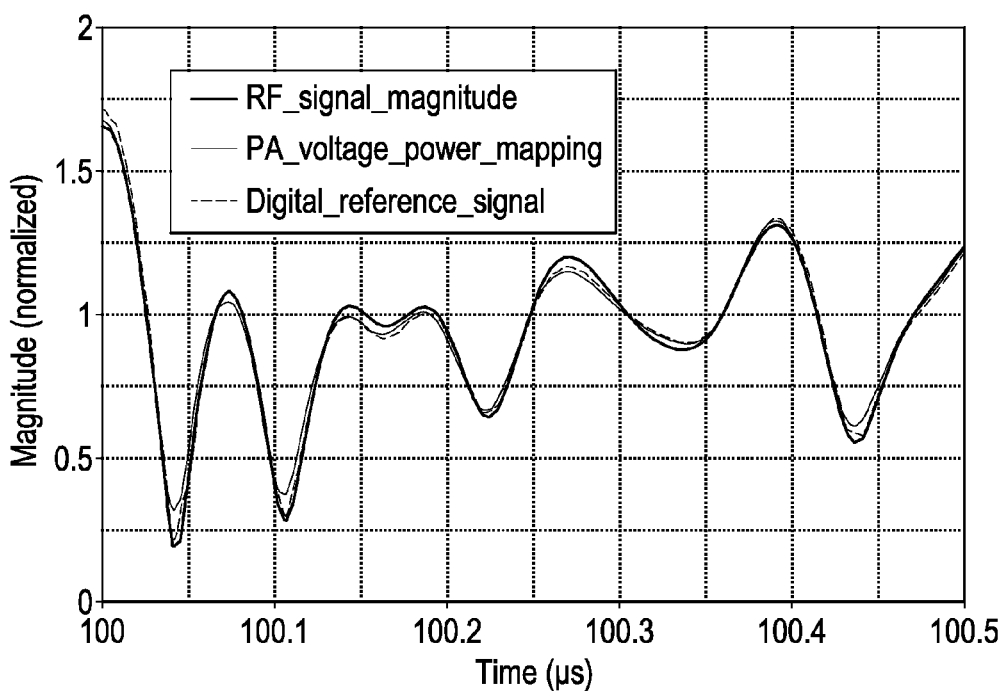
Fig. 2

ENVELOPE TRACKING AMPLIFIER FOR A TRANSMITTER HAVING A VOLTAGE MAPPING LINEARLY RELATED TO THE SQUARE OF THE AMPLITUDE OF THE BASEBAND SIGNAL

This application claims priority under 35 U.S.C. §119 or 365 to European Application No. EP 12170564.4, filed Jun. 1, 2012. The entire teachings of the above application are incorporated herein by reference.

The present disclosure relates to the general field of radio frequency communication.

In many wireless communication applications power consumption is dominated by the radio transmitter and in particular the last gain stage usually referred to as the power amplifier (PA). In a typical architecture the power amplifier is fed with a modulated signal which is amplified and transmitted via an antenna. In many applications a bandpass filter is placed between power amplifier and antenna to suppress out-of-band power.

In battery-operated equipment the power consumption of the power amplifier is of key significance for the battery lifetime of the device.

Schemes exist that aim to control the power consumption of the power amplifier. One of these schemes is called envelope tracking (ET) where the voltage supply of the power amplifier adapts to the instantaneous envelope of the power amplifier input signal. Some ET systems adapt to all input signal levels and some only come into play when the input signal rises to a certain level.

An advantage of envelope tracking is that the power amplifier operating point can be controlled with respect to the compression point so that the power-added efficiency (PAE) of the amplifier is maintained at a desired level.

The envelope tracking scheme is particularly suited for waveforms with a large peak-to-mean power ratio like orthogonal frequency division multiplexing (OFDM) and related transmission schemes (e.g. E-UTRAN's Single Carrier frequency division multiple access [SC-FDMA]). A typical architecture for envelope tracking is shown FIG. 1 described below. The transceiver chip provides an analog voltage signal Env to a power supply unit (ET modulator) which uses a linear transfer function (i.e. gain and offset) to provide the power amplifier supply voltage. As long as the envelope reference signal corresponds to the RF signal amplitude the supply voltage closely follows peaks and troughs of the signal.

Many communication systems use frequency multiplexing to transmit and receive signals at the same time. The separation between the transmit signal carrier and the receive signal carrier is called the duplex spacing and can be relatively small. For example, in a number of LTE (Long Term Evolution) FDD (Frequency division duplex) bands, the duplex spacing is just three times the channel bandwidth. This means that the distance between the extremes of transmit and receive channels may be just twice the signal bandwidth. In such a case, out-of-band noise at the output of the power amplifier should be limited to a very low level in order to minimize degradation of the receiver which is operating in a nearby frequency band.

Some of the following description is framed in terms of embodiments relating to LTE devices. The invention is not so restricted, however.

FIG. 1 shows a partial block diagram of a common front-end architecture with an FDD transceiver using a single antenna (11) for receive and transmit signals. The transceiver consists of a signal processing/transceiver chip (13) in use providing an RF output (14) to a power amplifier (15) that in turn feeds a duplexer (17) coupled to the dual purpose antenna (11). The signal processing part also has an RF input (16) coupled to the duplexer (17) for processing signals received on the antenna (11). An envelope signal (18) is output from the signal processing/transceiver chip (13) to an envelope tracking modulator (19). The envelope modulator (19) receives a voltage from a battery (21) and supplies voltage (22) to the power amplifier (15) to meet the needs of the RF signal (14) being amplified.

Noise at receive-frequency from the power amplifier (15) is attenuated by the duplexer (17). The duplexer attenuation is limited in practical systems to around 50 dB. This results in stringent power amplifier noise requirements. For example, to limit the noise at the receiver input to −180 dBm/Hz (6 dB below noise floor), the noise at the power amplifier output must be kept below −130 dBm/Hz.

Noise at the output of the power amplifier (15) may be due to amplified noise from the signal processing/transceiver chip (13) or thermal noise added by the power amplifier (15) itself, or more likely both.

There are two additional mechanisms that contribute to power amplifier out-of-band noise. These two mechanisms are explained below. They present a significant challenge for applying envelope tracking in communication systems operating in FDD bands with small duplex spacing compared to the signal bandwidth.

The first mechanism relates to noise in the voltage supply line. Because the supply line of the power amplifier (15) has relatively low impedance and the power amplifier output is normally matched to 50Ω, any noise voltage at the power amplifier supply is effectively amplified. Typically, the voltage gain is around 4-6 dB across the power amplifier. The envelope tracking modulator (19) typically also has 6 dB voltage gain as it translates a reference signal with 1V differential peak-to-peak amplitude to a power amplifier supply voltage of 1-5V. This results in extremely stringent noise requirements on the analog reference signal at frequencies corresponding to the FDD duplex separation.

The second mechanism relates to mixing products. Mismatch between the signal envelope and the supply voltage creates mixing products, especially when the power amplifier (15) is operated close to its compression point. For example, if the transmit signal (14) and supply voltage (22) are not perfectly aligned in time then the peaks and troughs of the signal are out of sync with the required voltage and clipping occurs when the signal amplitude changes. Clipping in turn results in unwanted out-of-band power.

Apart from relative signal delays there are numerous other transceiver impairments that lead to small but significant differences between transmit envelope and associated supply voltage. These include gain and phase ripple of analog channel filters, RFIC non-linearities, quadrature (gain and phase) imbalance, carrier leakage, phase noise or digital-to-analog converter quantization noise. Another contributor is bandwidth limitation of the envelope signal path. The spectrum of the envelope signal is typically much wider than the bandwidth of the transmit signal. This is especially true for modulation schemes where the I/Q time-domain trajectory crosses the origin of the complex plane or comes close to it.

While some of these impairments directly degrade the signal quality (typically measured as transmit error vector amplitude (EVM)), certain impairments are only significant when envelope tracking is used. To illustrate the effect of such impairments FIG. 2 shows scaled versions of the transmit signal envelope and the power amplifier supply voltage along with a digital reference signal. Slight distortions mainly due to filtering imperfections and local oscillator (LO) leakage create mismatches between the signals which result in out-of-band noise at the power amplifier output.

In FIG. 2, signals are scaled to a common reference level and delay. This graph shows the transmit signal envelope in a heavy line, a power amplifier supply voltage mapping signal as a dotted line and digital reference signal as a dashed line.

Envelope tracking is currently a topic of intense research and development. The MIPI Alliance has proposed a basic architecture where both transmit signal and analog envelope signal are provided by the transceiver chipset. FIG. 3 shows a partial block diagram of a chip (30) where the signal envelope is calculated in the digital domain in direct conversion receiver architecture.

In this architecture digital I and Q (in-phase and quadrature) samples (32,34) are fed to respective digital-to-analog converters (35, 37), each having a respective analog output fed to respective I/Q filters (39,41) and thence to variable gain I and Q amplifiers (43, 45). The amplified outputs are fed to respective mixers (47,49) where they are mixed with in-phase and quadrature versions of a local oscillator frequency (LO, LO'). The mixer outputs are combined together and fed to a buffer/driver (51) and output to a power amplifier and antenna (not shown).

The digital I and Q samples (32,34) are also fed to a processing path (33) which first (55) calculates $I^2(t)+Q^2(t)$. The squaring doubles the frequency space occupied by the signal with respect to the transmit signal bandwidth. Therefore, the I/Q sampling frequency must be high enough to avoid aliasing. In the following steps, gain (57) and delay (59) are adjusted so that they match as closely as possible the delay and gain in the transmit path (and any gain and delay off-chip). Next, a mapping or shaping function (61) is applied to relate the instantaneous signal amplitude to the required power amplifier voltage, before conversion to analog in an envelope digital-to-analog converter (63) and passing through an envelope filter (65).

The actual mapping function is specific to the power amplifier design but conventionally it may consist of a minimum constant level corresponding to a minimum voltage required by the power amplifier for small signals (typically around 1.0V) and a non-linear term closely following a square-root profile for larger signal amplitudes. The transition region between flat region and square-root profile is smoothed to avoid creating high harmonic content when the signal moves through the transition region. One possible implementation for the mapping function is a look-up table.

The non-linear mapping leads to a drastic widening of the envelope signal bandwidth. This is a well-known phenomenon often discussed in the context of polar modulation techniques. FIG. 4 shows the spectra of a filtered 20 MHz 100RB LTE uplink signal and its envelope on a 1 GHz carrier (for illustration). The envelope signal has significant power contributions (around −10 dBV/MHz) beyond twice the bandwidth of the transmit signal.

To preserve most of the higher frequency contributions in the envelope spectrum the envelope filter (65) has a cut-off frequency well beyond the transmit signal bandwidth. This, however, means that any quantization noise from the envelope digital-to-analog converter (63) is not efficiently filtered and digital-to-analog converter noise thus will appear on the power amplifier voltage supply. This means that the envelope digital-to-analog converter (63) needs to be a very high precision digital-to-analog converter if FDD bands with small duplex spacing are to be supported.

The envelope digital-to-analog converter (63) is not the only circuit with challenging requirements. Because mismatches between the envelope signal (Env) and the transmit signal (TX) have to be kept to a minimum, very stringent requirements have to be placed on all circuitry generating these signals.

For example, the timing mismatch between the transmit signal and envelope signal is ideally in the region of 1 ns to maximize the power amplifier efficiency. This also means that the group delay ripple of both I/Q filters (39, 41) and envelope filter (65) are to be well below a few nanoseconds. At the same time, the gain response would need to be very flat. More stringent requirements likely result in a higher power consumption and reduce the power saving benefit of the envelope tracking scheme.

Generally, impairments may be characterized by the amount of envelope distortion they cause, where envelope distortion (ED) is defined using a metric similar to error vector amplitude but in the time domain:

$$ED(\%)=\text{Sqrt}[\{|e(t)-e_{ref}(t)|^2\}/\{|e_{ref}(t)|^2\}],$$

where { . . . } denotes the time average, e(t) is the voltage envelope at a particular point in the system and $e_{ref}(t)$ is another reference point. With this definition, envelope distortion of different blocks in the signal chain add up as root of sum of squares of the individual envelope distortion contributions. This allows quantifying of the contributions from different circuit blocks.

For some impairments, e.g. I/Q imbalance, the envelope distortion contribution is the same as the contribution to EVM. LO leakage, on the other hand, does not contribute to EVM in LTE systems as the subcarrier at zero offset carries no data. However, it does contribute to envelope distortion. The level specified for LO leakage by 3GPP is −25 dBc=5.6%.

Note that a distortion of 40% means that there is next-to-no correlation between the two signals. A delay mismatch by the length in nanoseconds of one LTE sample (1/30.72 MHz=32.55 ns) means that correlation is completely lost. For small delays the relation is roughly linear with slope of 2% per nanosecond delay.

Other impairments may be equated to this by using the envelope distortion metric. For example, −25 dBc LO leakage is equivalent to 5.6% envelope distortion or 2.8 ns relative delay. For a realistic system the total envelope distortion combining all impairments will be in the order of 10% equivalent to 5 ns delay.

This disclosure starts from a realization that there is a trade-off between power efficiency (aggressiveness of supply reduction) and tolerance against circuit imperfections. A power amplifier operating in a linear region (substantially constant gain versus input power) is fairly forgiving to imperfections. However, the same amplifier operated in non-linear conditions, for example in a compression region, amplifies imperfections. For example, LO leakage is a phenomenon where an extra tone is added into the transmit signal. If the power amplifier is linear this tone is passed through. If, however, the power amplifier is run at 2 dB compression the gain will move up and down with the extra tone present and this will create mixing products.

There is disclosed a method of operating an amplifier comprising modulating the supply to the amplifier in accordance with a linear function of the square of the baseband signal amplitude.

There is also disclosed a method of operating an amplifier comprising modulating the supply to the amplifier in accordance with a linear function of the amplitude squared of the input signals.

There is also disclosed a method of transmitting an RF signal derived from baseband samples, comprising modulating information derived from the baseband samples onto a RF carrier, and amplifying the modulated signal in an amplifier, wherein the step of amplifying comprises applying a voltage mapping to the amplitude of the baseband samples to control the amplifier supply, wherein the voltage mapping is a linear function of the square of the amplitude of the baseband samples.

The method may comprise converting a digital signal to analog to form said resultant signal.

The mapping function is typically constructed such that the power efficiency of the power amplifier is maximized whilst at the same time the linearity requirements are met. This particular choice of mapping function is referred to herein as the "power mapping function".

The method may further comprise determining a power mapping signal, and forming the voltage mapping to be tangential to the power mapping signal.

The method may further comprise selecting a point on the power mapping signal at which the voltage mapping signal is tangential to the power mapping signal.

In one embodiment, the point is a point corresponding to the average of the baseband signal amplitude squared.

In another embodiment, the point is in a range between 0.75 times the square of the average signal amplitude and 3 times the square of the average signal amplitude.

In one family of embodiments the point is selected based upon out-of-band noise requirements.

The RF signal may be a signal meeting LTE standards.

There is also disclosed a transceiver having a transmitter configured to transmit, via a transmit antenna, an RF signal derived from baseband samples and a receiver for receiving signals from a receive antenna, the transmitter comprising a modulator for modulating information derived from the baseband samples onto a RF carrier, and an amplifier for amplifying the modulated signal for application to the transmit antenna, wherein the transmitter comprises processing circuitry for deriving a amplitude signal indicative of the instantaneous amplitude squared of the baseband samples, the processing circuitry configured to apply a voltage mapping to the amplitude signal to provide a resultant signal and an envelope modulator for using the resultant signal to control the voltage applied to the amplifier, wherein the voltage mapping is a linear function of the square of the amplitude of the baseband samples.

The transceiver may be a frequency division duplex transceiver wherein the transmit and receive antennas are a single duplex antenna.

The FDD transceiver may be adapted for LTE signals.

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

FIG. 1 shows a schematic diagram of a duplex transceiver employing envelope tracking.

FIG. 2 is a graph showing scaled versions of a transmit signal envelope, power amplifier supply voltage and a digital reference signal.

In this disclosure the envelope signal is modified so that voltage headroom is provided to the power amplifier. This headroom may be scalable so that it can be adjusted depending on the power amplifier output noise requirements. In scenarios where power amplifier output noise is not critical (e.g. for TDD bands or FDD bands with large duplex spacing) or where power amplifier noise in the receive band is known to be lower (e.g. because of narrow transmit bandwidth or low transmit power) the headroom can be reduced so that the full power efficiency gain of the envelope tracking scheme can be exploited. On the other hand, in scenarios where the power amplifier output noise targets become challenging, the headroom can be increased in order to accommodate any circuit impairments.

Figure 3:
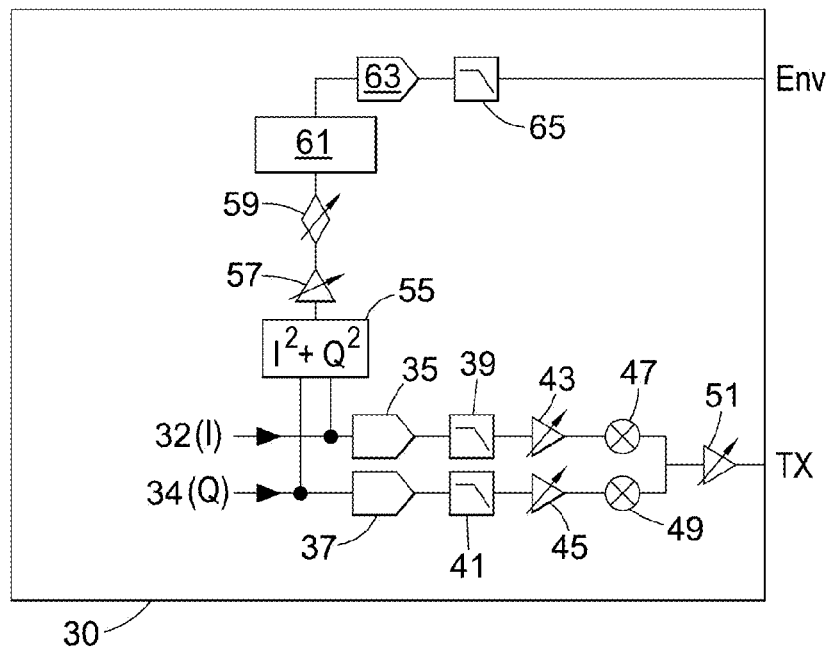
FIG. 3 is a simplified partial diagram of an I-Q transmitter chip including some envelope tracking elements.
Figure 4:
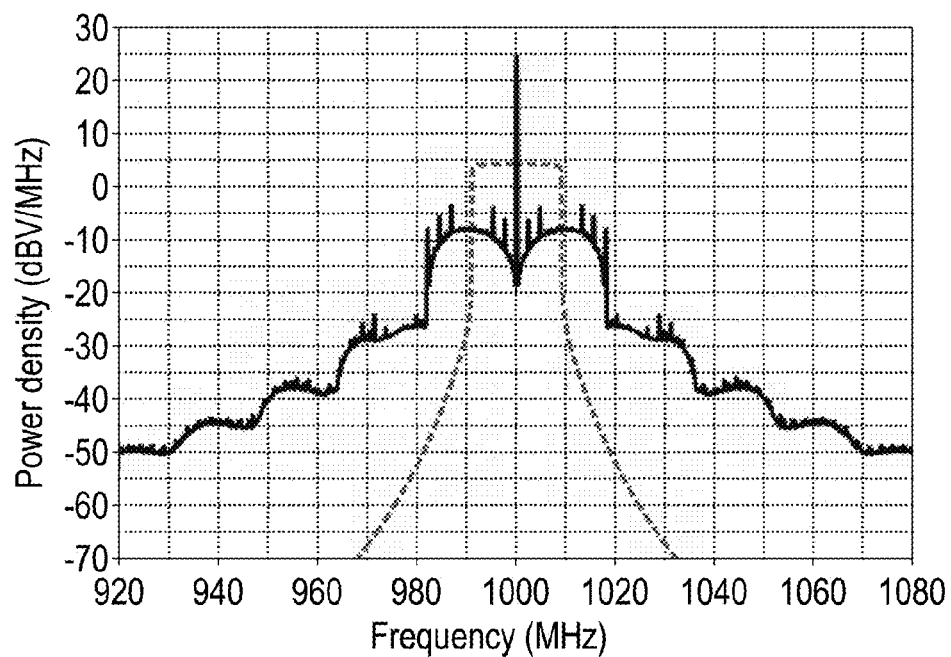
FIG. 4 is a graph showing the spectra of a filtered 20 MHz LTE uplink signal and its envelope on a 1 GHz carrier.

One possible way of increasing the power amplifier voltage headroom is to simply add a constant voltage margin on top of the minimum voltage required. In FIG. 3 a constant would be added after the mapping function and before the envelope digital-to-analog converter. This added margin will allow for some tolerance in delay between transmit signal and power amplifier supply. However, it will also severely degrade the power added efficiency of the power amplifier. Also, the spectral width of the envelope signal would remain unchanged which means the envelope path must retain a wide bandwidth and digital-to-analog converter noise cannot be filtered.

This disclosure proposes a different way of providing voltage headroom.

The time average of the transmit signal squared is $\{I^2(t)+Q^2(t)\}$. For this calculation, this average is scaled to unity, so $$\{I^2(t)+Q^2(t)\}=1$$

Where $\{\ldots\}$ signifies the time average over a suitably large duration.

The power mapping function approximately follows a square-root profile at least for large signal amplitudes.

A time-dependent parameter $d(t)$ is defined as the difference between the current square of the signal amplitude and the square of an arbitrary value M of the signal amplitude, as follows:

$$d(t)=I^2(t)+Q^2(t)-M^2,$$

where M is a positive constant.

From this, by simple manipulation, $d(t)+M^2=I^2(t)+Q^2(t)$, and hence $$Sqrt[d(t)+M^2]=Sqrt[I^2(t)+Q^2(t)]$$

Hence the power mapping function can be approximated to be $$M+d(t)/(2M).$$

This disclosure suggests a mapping function that is tangential to this power mapping function and is linear.

There is one degree of freedom in choosing where to put the tangent. M is the parameter that relates to this choice.

Figure 5:
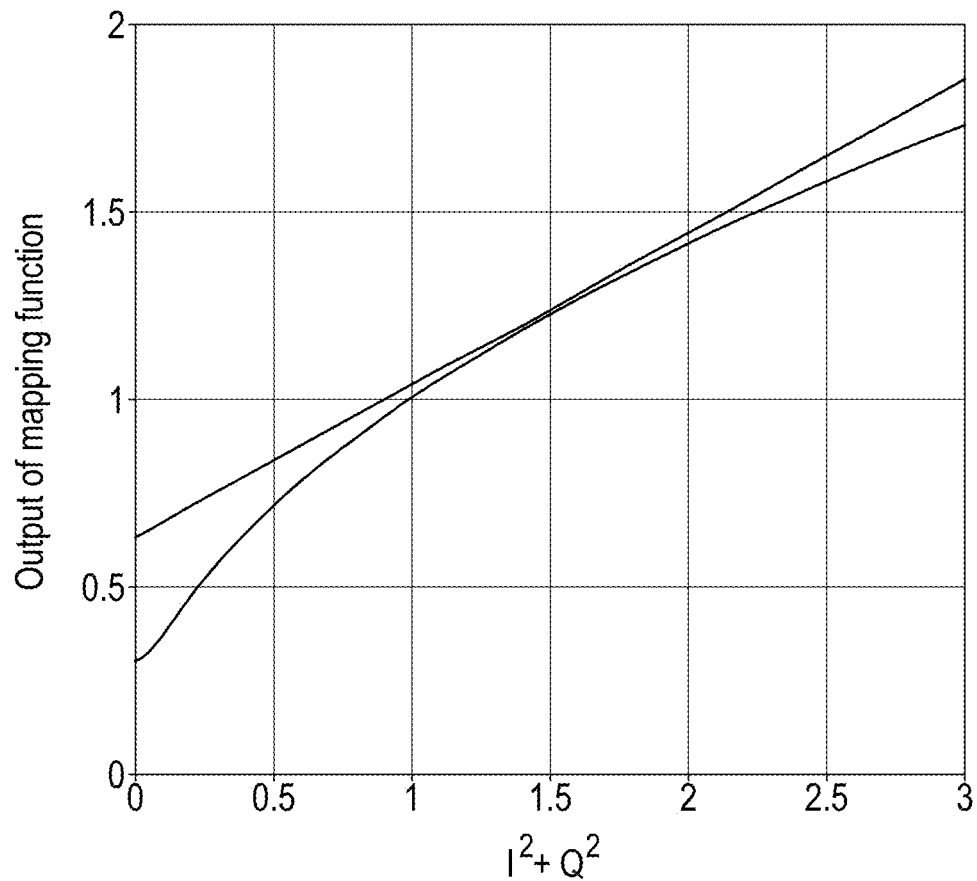
FIG. 5 is a graph showing a comparison between a mapping function for maximizing power amplifier efficiency and a linear mapping function.

FIG. 5 shows the power mapping function (which, as noted above, maximizes power amplifier efficiency) compared to a linear approximation. The power mapping function is the curved characteristic, and the linear approximation is the upper straight line. In this instance it is tangential to the power mapping function at the location $M^2=1.5$.

Figure 6A:
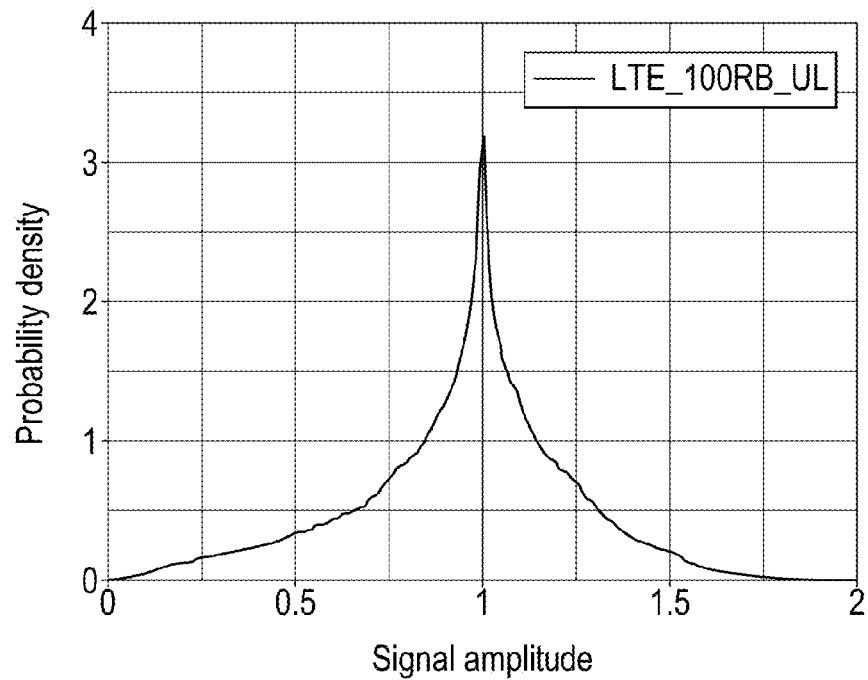
FIG. 6a is a sketch showing the probability density against LTE signal average amplitude.

The disclosure is of particular importance to LTE transceivers. The LTE signal is formed such that most of the time its amplitude is close to the average amplitude—see FIG. 6a.

Figure 6B:
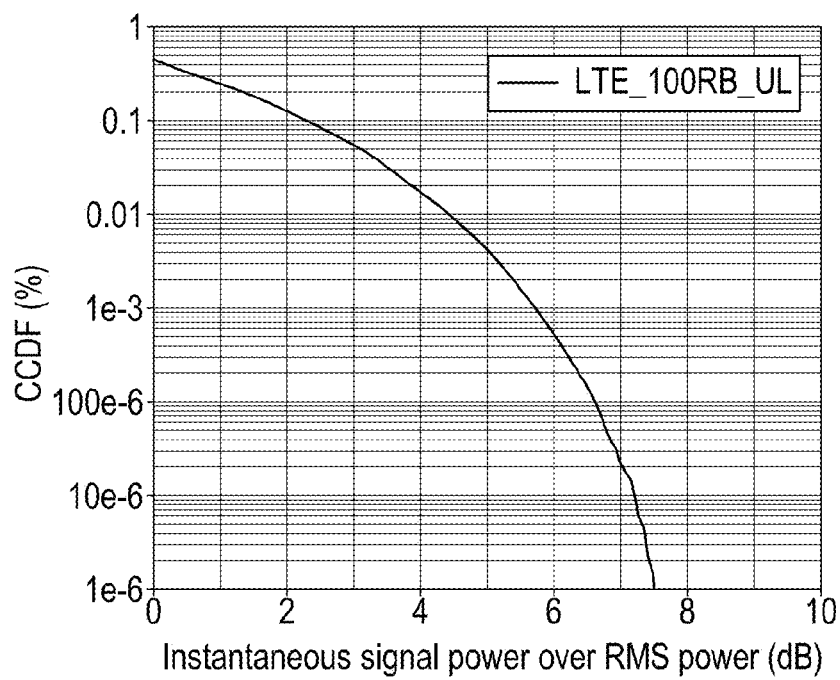
FIG. 6b is a sketch showing the complementary cumulative density function.

FIG. 6b shows the CCDF curve for a SC-FDMA signal (CCDF=complementary cumulative density function). It shows the probability of the instantaneous signal power exceeding a certain power above RMS. For example, around 50% of the time the power exceeds average power as would be expected. For higher powers it drops off sharply, much more quickly than for the more traditional OFDM modulation.

The CCDF plot resolves very well the very low probability tail-end of the distribution where the signal power is well above the average. However, the PA will clip signals larger than around 4-5 dB above the RMS power. The resultant out-of-band power is acceptable.

The supply voltage associated with the very highest signal peaks will also be high. A practical power supply will not be able to exceed a certain supply level and will also start clipping the supply peaks. In fact, with our linear mapping the supply would hit the limit more often than with the power mapping function because it's trying to achieve a greater headroom. However, the supply voltage with the linear mapping will be at least as high and typically higher than with the power mapping and therefore the average unwanted out-of-band products are lower.

Where the tangent is put onto the curve at $M^2=1$ (ie M=1), this is the point marking the average signal amplitude squared. It is a natural choice and one that achieves good power efficiency but not so much average headroom.

If instead the tangent were put higher on the curve, at $M^2=2$, this is twice the average amplitude squared of an LTE signal. This achieves more headroom most of the time at the expense of power efficiency.

The parameter M can be selected according to needs. Close to one for aggressive power optimization when out-of-band noise is not an issue (e.g. when overall TX power is low or signal bandwidth is low) or higher up on the curve when the out-of-band noise must be controlled.

One advantage of a linear mapping function is that the spectrum of the envelope of the output signal is confined to twice the signal bandwidth. This is demonstrated in FIG. 6 for a 20 MHz LTE UL signal.

Figure 7:
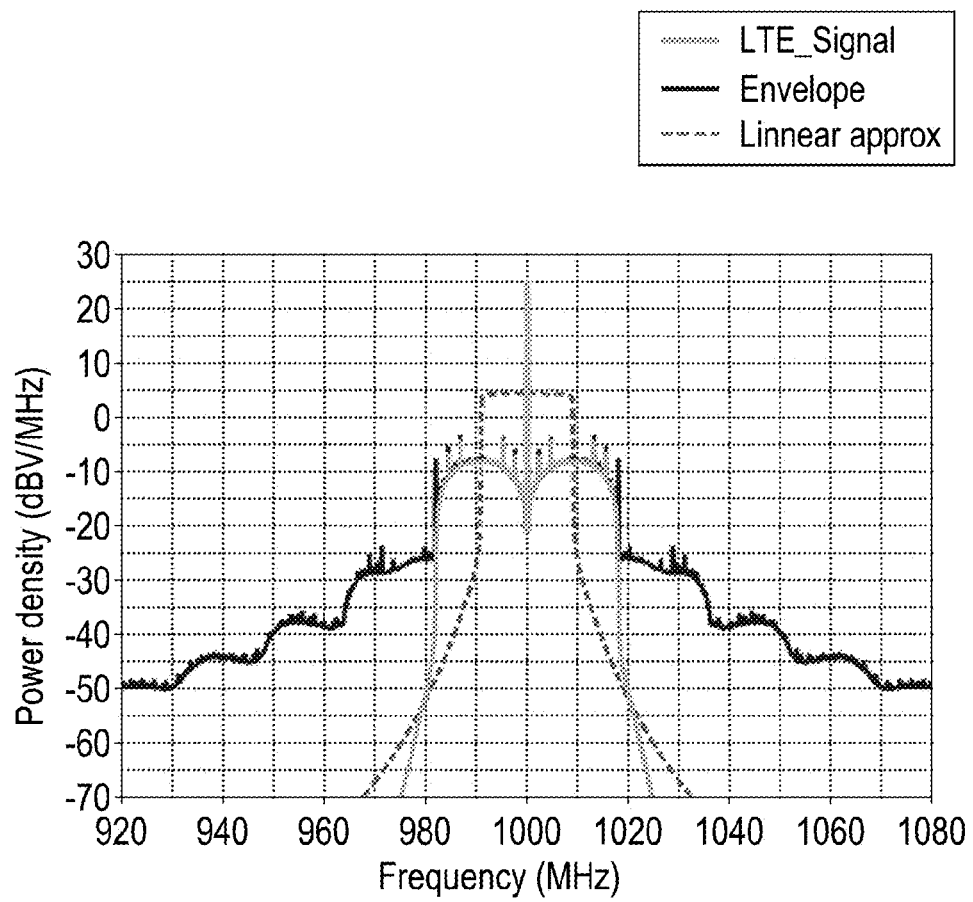
FIG. 7 shows a view similar to FIG. 4 but with a linear mapping function.

FIG. 7 shows spectra of a filtered 20 MHz LTE uplink signal, its envelope and the linear approximation of the envelope signal at one a 1 GHz carrier (for illustration). The linear approximation means the power amplifier voltage signal is confined to twice the transmit signal bandwidth.

Consequently, the digital-to-analog converter sampling frequency may be as low as four times the signal rate and a filter in the envelope path can effectively remove any digital-to-analog converter noise at the duplex spacing frequency. This drastically reduces the digital-to-analog converter precision requirements.

The lower signal bandwidth of the envelope signal path also means that the power supply for the envelope tracking does not need to follow frequencies beyond twice the signal bandwidth. This allows simplification of the design of the power supply and can allow its intrinsic efficiency to be increased.

Another advantage of the linear mapping is that the digital implementation is simplified. While the non-linear mapping is typically achieved using a look-up table which may involve large memory requirements, the linear mapping can be done efficiently using hard coded logic circuitry.

The first order approximation is a strict upper bound to the square-root function. Therefore, the power amplifier power added efficiency is reduced. The exact level of reduction depends on the minimum voltage required by the power amplifier and also on the modulation scheme. For an LTE uplink signal the sacrificed power efficiency is surprisingly small. This is because the SC-FDMA modulation (used in LTE) achieves a signal whose amplitude distribution is closely concentrated around the average power level. The amount of average headroom is also adjustable through the parameter M as defined above.

Figure 8:
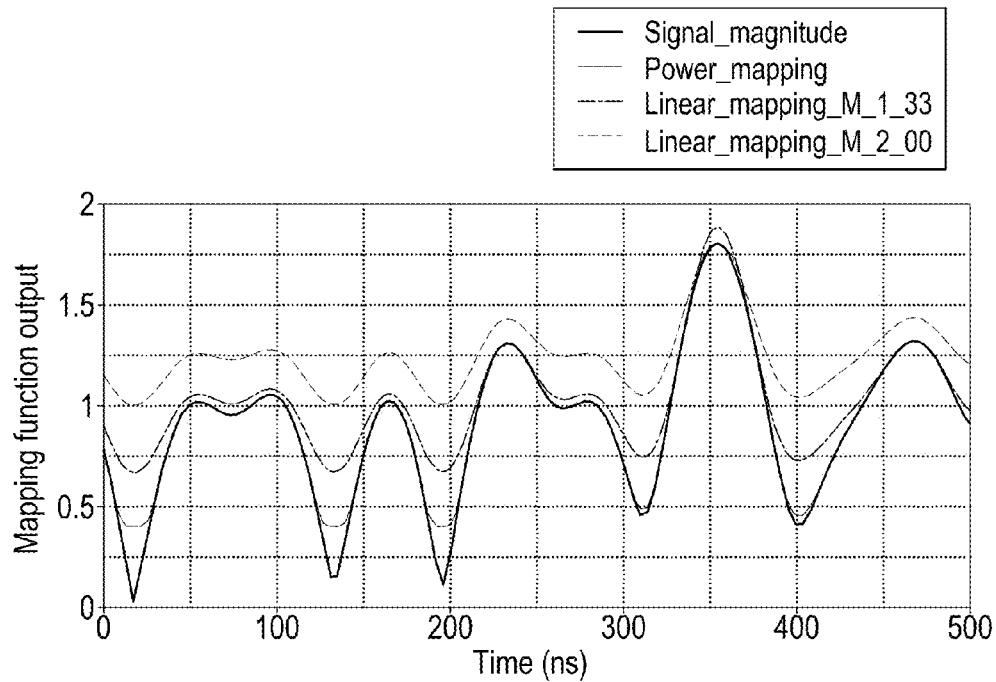
FIG. 8 is a graph showing an LTE 100 RB uplink signal, the effect of a mapping function for maximizing power amplifier efficiency and two linear mapping functions.

FIG. 8 shows three plots of mapping function output with time for an LTE 100 RB uplink signal, as the lowest plot (solid line). The next higher plot, the dotted plot, shows the above-defined power mapping in which the envelope is caused to make the power amplifier as power-efficient as possible. The next higher plot (larger dots) shows a linear relation of mapping to the square of the signal power, which provides a headroom in most signal areas (M=1.33) and the topmost plot (dashed) showing a linear relation similar to the previous plot but with M=2 and showing greater headroom.

In the following, results are presented based on a SystemVue numerical model of a typical transceiver, ET modulator and power amplifier. We evaluate what the impact of the linear mapping function is on both the tolerance of the scheme against system impairments and on power-added efficiency.

Figure 9:
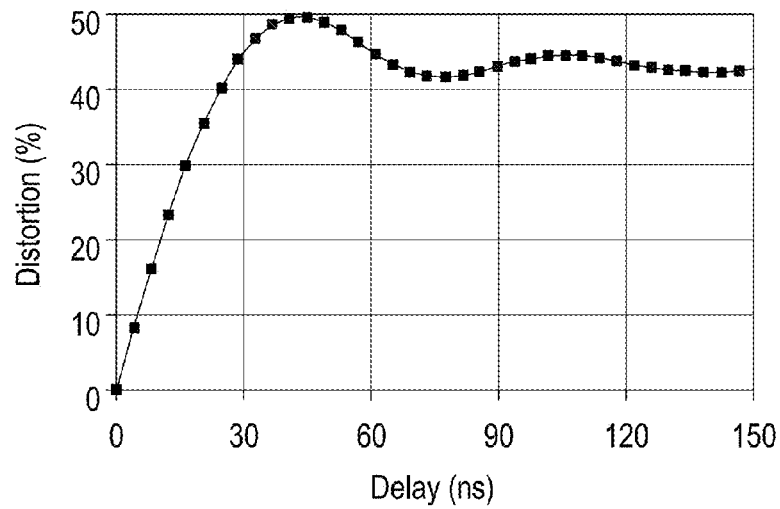
FIG. 9 is a graph showing the relation between relative delay between the transmit signal and the PA voltage signal, and the envelope distortion between them.

The model is of a 20 MHz 100RB LTE uplink signal, with analysis restricted to a single impairment, a relative delay between transmit signal and power amplifier voltage signal. The relative delay results in envelope distortion as defined above. The relation between the two is shown in FIG. 9, which shows power amplifier output noise as a function of delay mismatch for the power mapping function (achieving 67.4% power added efficiency) and for applied constant headroom of 10%, 20% and 30% of the mean value of the power mapping voltage signal.

To evaluate the system performance under the influence of delay mismatch, the power density is measured outside the transmit band. Depending on the modulation scheme and system requirements the most critical out-of-band requirement may be at different frequency offsets. Focus here is on the noise density at 50 MHz offset from the transmit carrier where the aim is for a noise density of −135 dBm/Hz.

Figure 10:
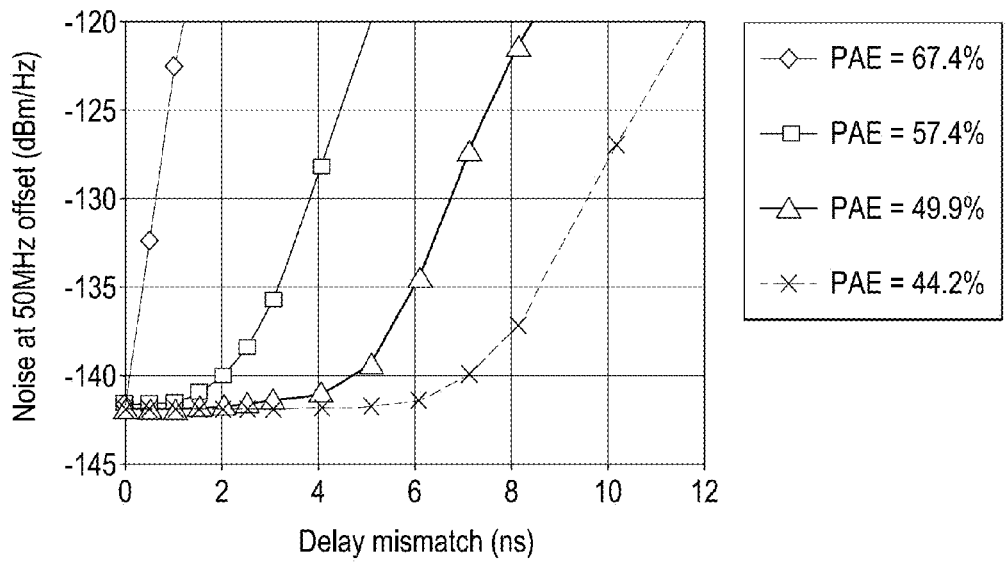
FIG. 10 is a plot of noise impairments for the power mapping function and for different values of constant voltage headroom.

In a first experiment the above-defined power mapping function is used, sweeping the delay mismatch between TX and Env signals. The noise density 50 MHz from the transmit carrier rapidly increases with delay mismatch as expected. When a constant voltage headroom corresponding to 10%, 20% or 30% of the mean power amplifier voltage is added the noise density stays within spec as long as the delay mismatch is not too large. However, the added constant headroom reduces power efficiency. The results can be seen in FIG. 10 in which power amplifier output noise is presented as a function of delay mismatch for the power mapping function (achieving 67.4% power added efficiency) and for applied constant headroom of 10%, 20% and 30% of the mean value of the power mapping voltage signal.

Figure 11:
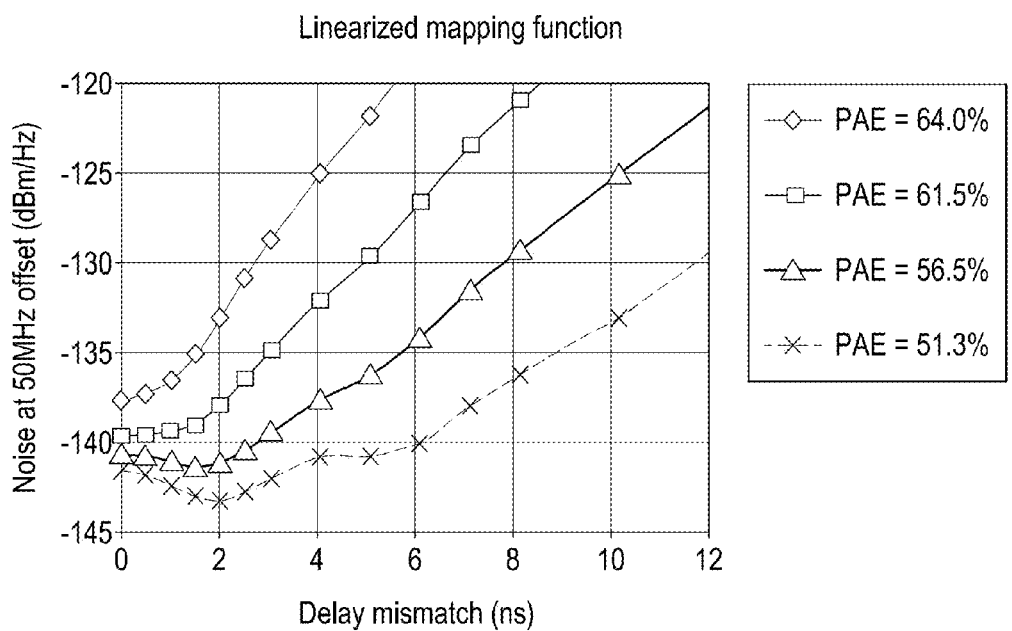
FIG. 11 is a graph showing PA output noise as a function of delay mismatch for different linear mapping functions.

In a second experiment there is used a linear mapping and with different values of M chosen. For M=1 the linear approximation is performed for average signal power giving best efficiency. For larger values of M the linear approximation is done at higher than average signal power which increases the voltage headroom on the power amplifier. The results are shown in FIG. 11, showing power amplifier output noise as a function of delay mismatch for different values of M (M=1, 4/3, 3/2, and 2).

For values of M close to unity the power efficiency is highest but the power amplifier noise increases quickly with increasing delay mismatch. For larger values of M the power added efficiency PAE is worse but the out-of-band power is less sensitive to mismatches.

Figure 12:
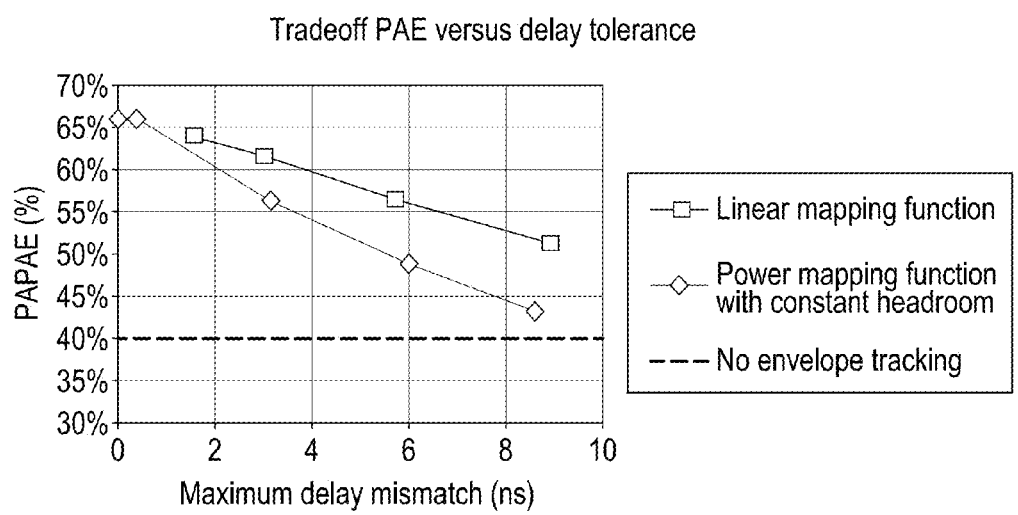
FIG. 12 shows a trade-off between power amplifier power efficiency versus delay mismatch.

FIG. 12 shows the power amplifier power-added efficiency as a trade-off against the allowable signal mismatch. The target noise power density at 50 MHz offset from the LTE uplink carrier is set to −135 dBm/Hz. For comparison, there is also plotted the trade-off when a constant headroom is applied. The curve marked "linear mapping function" shows the performance of the proposed scheme. The curve marked "power mapping function and constant headroom" provides a comparison for the technique where constant headroom is added. The "no envelope tracking" curve shows the power added efficiency of the power with constant supply voltage. All points achieve a noise level of −135 dBm/Hz at 50 MHz from the LTE carrier at full power.

The results show that in order to accommodate signal impairments power-added efficiency must be sacrificed. However, with the linear approximation method this loss in efficiency is much lower than if a constant margin is applied.

As mentioned above, it is expected that for a realistic system the overall distortion is equivalent to around 5 ns. This means that the full efficiency theoretically possible with envelope tracking (around 67% in the model) must be reduced to around 57% in order to meet out-of-band noise requirements. This is still well above the efficiency that can be realized with a fixed supply voltage (40% in our model). Note that as power amplifier transmit power is reduced or the occupied channel bandwidth lowered the headroom can be reduced.

In summary, the disclosure envisages a scheme where the mapping function relating instantaneous signal amplitude squared to power amplifier voltage is linearized. The linearization adds headroom to the power amplifier voltage supply which means some power efficiency is sacrificed. There is disclosed a linear approximation that models the tangent on the non-linear power mapping function. More generally, any first order function may be used. The scheme of using an envelope signal with the linear relation to the square of the instantaneous signal amplitude reduces the envelope signal bandwidth and thereby allows significant relaxation of requirements on the circuit design, in particular digital-to-analog converter precision and filtering requirements but also requirements on the ET power supply.

The linear approximation provides a flexible supply voltage headroom to the power amplifier which maybe tuned according to the transmission scenario (band, occupied signal bandwidth, transmit power level). The headroom makes the system more tolerant to impairments like delay mismatch between transmit signal and envelope signal. This leads to further easing of design constraints and can also reduce the amount of production calibration necessary.

In the above explanation there is description of I and Q signals and how to calculate the signal amplitude ($Sqrt[I^2+Q^2]$). I and Q signals are associated with certain types of transmitter architectures (quadrature modulators). However, in any system there will be a baseband representation of the RF signal that is ultimately transmitted. All that is then necessary in the digital processing domain is to calculate the square of the signal amplitude. Depending on how the signal is represented this can be performed in different ways but it will always be possible. If the signal is presented as real and imaginary part then the preceding explanation applies. If the signal is represented in polar coordinates, for example, then the amplitude is already known and only needs to be squared.

While this invention has been particularly shown and described with references to example embodiments thereof, it will be understood by those skilled in the art that various changes in form and details may be made therein without departing from the scope of the invention encompassed by the appended claims.

What is claimed is:

1. A method of transmitting an RF signal derived from baseband samples, comprising:
    modulating information derived from the baseband samples onto a RF carrier, and amplifying the modulated signal in an amplifier,
    wherein the amplifying comprises applying a voltage mapping, provided to the amplifier, to an amplitude of the baseband samples to control the amplifier supply, wherein the voltage mapping provided to the amplifier is a linear function of a square of the amplitude of the baseband samples,
    determining a power mapping signal representative of a mapping giving optimal amplifier power efficiency,
    forming the voltage mapping to be tangential to the power mapping signal, and
    selecting a point on the power mapping signal at which the voltage mapping signal is tangential to the power mapping signal,
    wherein the point is a point corresponding to a square of the average signal amplitude or the point is in a range between 0.75 times a square of the average signal amplitude and 3 times the square of the average signal amplitude.

2. The method according to claim 1, wherein the baseband samples comprise in phase and quadrature samples.

3. The method according to claim 1, further comprising selecting the point based upon out-of-band noise.

4. The method according to claim 1 wherein the RF signal is a signal meeting LTE standards.

5. A transceiver comprising:
    a receiver for receiving signals from a receive antenna; and
    a transmitter configured to transmit, via a transmit antenna, an RF signal derived from baseband samples, the transmitter comprising:
        a modulator for modulating information derived from the baseband samples onto a RF carrier;
        an amplifier for amplifying the modulated signal for application to the transmit antenna;
        processing circuitry for deriving an amplitude signal indicative of an instantaneous amplitude of a square of the baseband samples, the processing circuitry configured to apply a voltage mapping, provided to the amplifier, to the amplitude signal to provide a resultant signal; and an envelope modulator for using the resultant signal to control the voltage applied to the amplifier, wherein the voltage mapping provided to the amplifier is a linear function of the square of the amplitude of the baseband samples;

wherein the processing circuitry is further configured to determine a power mapping signal representative of a mapping giving optimal amplifier power efficiency, form the voltage mapping to be tangential to the power mapping signal, and select a point on the power mapping signal at which the voltage mapping signal is tangential to the power mapping signal, wherein the point is a point corresponding to a square of the average signal amplitude or the point is in a range between 0.75 times a square of the average signal amplitude and 3 times the square of the average signal amplitude.

6. The transceiver according to claim 5 wherein the baseband samples are in-phase and quadrature signals.

7. The transceiver according to claim 5 wherein the baseband samples are digital.

8. The transceiver according to claim 5 wherein the transmit and receive antennas are a single duplex antenna.

9. An FDD transceiver adapted for LTE signals, comprising the transceiver of claim 5.

10. A transceiver comprising:
a receiver for receiving signals from a receive antenna; and
a transmitter configured to transmit, via a transmit antenna, an RF signal derived from baseband samples, the transmitter comprising:
  a modulator for modulating information derived from the baseband samples onto a RF carrier;
  an amplifier for amplifying the modulated signal for application to the transmit antenna;
  processing circuitry for deriving an amplitude signal indicative of an instantaneous amplitude of a square of the baseband samples, the processing circuitry configured to apply a voltage mapping, provided to the amplifier, to the amplitude signal to provide a resultant signal; and
  an envelope modulator for using the resultant signal to control the voltage applied to the amplifier, wherein the voltage mapping provided to the amplifier is a linear function of the square of the amplitude of the baseband samples;
wherein the processing circuitry is further configured to determine a power mapping signal representative of a mapping giving optimal amplifier power efficiency, form the voltage mapping to be tangential to the power mapping signal, and select a point on the power mapping signal at which the voltage mapping signal is tangential to the power mapping signal and based upon out-of-band noise.

11. A method of transmitting an RF signal derived from baseband samples, comprising:
modulating information derived from the baseband samples onto a RF carrier, and amplifying the modulated signal in an amplifier,
wherein the amplifying comprises applying a voltage mapping, provided to the amplifier, to an amplitude of the baseband samples to control the amplifier supply, wherein the voltage mapping provided to the amplifier is a linear function of a square of the amplitude of the baseband samples,
determining a power mapping signal representative of a mapping giving optimal amplifier power efficiency,
forming the voltage mapping to be tangential to the power mapping signal, and
selecting a point on the power mapping signal at which the voltage mapping signal is tangential to the power mapping signal and based upon out-of-band noise.

* * * * *